United States Patent
Peng et al.

Patent Number: 6,028,994
Date of Patent: Feb. 22, 2000

[54] METHOD FOR PREDICTING PERFORMANCE OF MICROELECTRONIC DEVICE BASED ON ELECTRICAL PARAMETER TEST DATA USING COMPUTER MODEL

[75] Inventors: Yeng-Kaung Peng; Chern-Jiann Lee, both of Los Altos; Siu-May Ho, San Jose, all of Calif.

[73] Assignee: Advanced Micro Devices, Sunnyvale, Calif.

[21] Appl. No.: 09/073,619

[22] Filed: May 6, 1998

[51] Int. Cl.[7] .................................................... G06F 9/455
[52] U.S. Cl. ........................................................ 395/500.36
[58] Field of Search ........................ 395/500.21, 500.34, 395/500.35, 500.36, 500.41; 364/224.1

[56] References Cited

U.S. PATENT DOCUMENTS

| | | | |
|---|---|---|---|
| 5,070,469 | 12/1991 | Kunikiyo et al. | 395/500.21 |
| 5,418,974 | 5/1995 | Craft et al. | 364/224.1 |
| 5,438,527 | 8/1995 | Feldbaumer et al. | 395/500.2 |
| 5,539,652 | 7/1996 | Togethoff | 395/500.35 |
| 5,719,796 | 2/1998 | Chen | 395/500.34 |

OTHER PUBLICATIONS

Yun and May, Evaluating the Manufacturability of GaAs/AiGaAs Multiple Quantum Weill Avalanche Photodiodes using Neural Networks, Jan. 1997, pp. 105–112.

Donnellan et al., Relating Statistical MOSFET Model ParameterVariabilities to IC Manufacturing Process Fluctuations Enabling Worst Case Design, Aug. 1994, pp. 306–318.

*Primary Examiner*—Kevin J. Teska
*Assistant Examiner*—Dan Fiul
*Attorney, Agent, or Firm*—David G. Alexander; Arter & Hadden LLP

[57] ABSTRACT

Electrical parameter testing and performance testing are performed on a plurality of microelectronic devices to obtain parametric values and performance values respectively. The parametric values are applied as inputs to a computer program such as a back propagation neural network engine which generates a performance prediction model by self-learning that implements a function relating the performance values to the parametric values. The model is used to predict the performance of devices being fabricated by performing electrical parameter testing on these devices and applying the resulting parametric values to the model as inputs to produce predicted performance values as outputs. The model can be configured to produce predicted performance values as percentages of devices having speed or other parameters in predetermined respective ranges. The model can be further configured to produce predicted performance values as percentages of devices having different types of defects. The model can be improved by self-learning using additional test values. The model can also be used to identify parameters which result in low performance and improve devices being fabricated by adjusting the corresponding process parameters.

24 Claims, 6 Drawing Sheets

METHOD FOR PREDICTING PERFORMANCE OF MICROELECTRONIC DEVICE BASED ON ELECTRICAL PARAMETER TEST DATA USING COMPUTER MODEL

BACKGROUND OF THE INVENTION

1. Field of the Invention

The present invention generally relates to the art of microelectronic integrated circuits, and more specifically to a method for predicting the performance of a microelectronic device based on electrical parameter test data using a computer model.

2. Description of the Related Art

Fabrication of microelectronic integrated circuit chips such as microprocessors, memories, etc. is extremely complex and involves a large number of process steps and variables. A defect in any of the process steps can result in the production of an entire lot of unusable chips. It is therefore necessary to monitor the quality of the chips throughout the fabrication process and detect any defects as early as possible so that time will not be wasted performing additional fabrication steps on defective circuits.

The integrated circuit fabrication process comprises performing numerous process steps including deposition, oxidation, etching, ion implantation, photolithographic definition, metallization, etc. to form a plurality of integrated circuit dies on semiconductor wafers. After these steps are completed, the wafers are subjected to Wafer Electrical Testing (WET) to obtain electrical circuit parameters or parametric test values.

A large number of tests are typically performed to obtain parameters. These values include, for example, $V_{TN}$ (threshold voltage of NMOS field effect transistors), $I_{DN}$ (source/drain current of NMOS transistors in the linear and saturation regions), $V_{TP}$ (threshold voltage of PMOS transistors), $I_{DP}$ (source/drain current of PMOS transistors), metal 1/2/3 sheet rho (transconductance of 1st, 2nd and 3rd metal layers), etc. It is not uncommon for WET testing to produce 150 to 300 or more parameters.

The wafers are then sorted based on the results of the WET testing. If certain parameters are out of tolerance for any of the dies on a wafer, at least the defective dies and in extreme cases entire wafers are rejected.

The next step of the process is assembly, in which the individual dies are cut away from the wafers and probed, passing dies will be assembled into individual packages which are provided with pins or other means for electrically interconnecting the microelectronic devices of the dies to external circuitry. The assembled chips are then subjected to package testing to determine if the interconnections have been made properly.

Finally, the finished integrated circuit chips are subjected to functional and performance testing. The former tests including applying electrical test signals or test vector sets to inputs of the chips and reading data appearing at the outputs to detect any functional defects in the chips. The latter tests include testing the operating speed and other characteristics of the chips.

Regarding operating speed, any chips which perform below a minimum criteria, for example 80 Mhz, will be rejected. Chips having speeds above the minimum value will be graded for sale at different quality levels and prices. For example, quality levels A, B and C may correspond to operating speeds of above 100 Mhz, 90 to 100 Mhz and 80 to 90 Mhz respectively.

It is desirable to predict performance parameters including the operating speeds and possible reject conditions in a production lot of chips as early as possible, and using WET test data after fabrication is a logical step to check overall process and functionality of devices. It seems to be a common choice for people to use WET data to predict device preformance. Since there is a large number of parameters and complex interaction between parameters, this is extremely difficult to perform with a high degree of accuracy. Conventional evaluation of WET parameters and device performance is as much an art as a science, and is subjectively based on intuition resulting from years of extensive experience in semiconductor fabrication.

Although attempts have been made to automate evaluation of WET parameters to provide objective criterion, such expedients have been limited to a small number, for example three, key parameters and have provided limited results of questionable reliability.

It is also desirable to detect process conditions which would result in less than satisfactory performance during the lengthy fabrication process and provide adjustments which improve the quality of the products. For example, a few test wafers of a production lot can be tested or measured against process specs, and the test results used to fine-tune the fabrication of the remainder of the lot.

SUMMARY OF THE INVENTION

In view of the above, a need has existed in the art of microelectronic integrated circuit fabrication for an automated and objective method of predicting the performance of integrated circuit chips based on electrical test parameters obtained at an early stage of fabrication. A need has further existed for a method which enables isolation of test parameters which, if different, would produce higher predicted performance, and feeding this information back to the production facility such that the fabrication process can be advantageously adjusted.

These needs are fulfilled by the present invention. More specifically, electrical parameter testing and performance testing are performed on a plurality of microelectronic devices to obtain parametric values and performance values respectively. The parametric values are applied as inputs to a computer program such as a back propagation neural network engine which generates a computer performance prediction or correlation model by self- learning that implements a function relating the performance values to the parametric values.

The model is used to predict the performance of devices being fabricated by performing electrical parameter testing on these devices and applying the resulting parametric values to the model as inputs to produce predicted performance values as outputs. The model can be configured to produce predicted performance values as percentages of devices having speed or other parameters in predetermined respective ranges. The model can be further configured to produce predicted performance values as percentages of devices based on different types of characteristics of parametric data.

The model can be improved by self-learning using additional test values. The model can also be used to identify parameters which result in low performance and improve devices being fabricated by adjusting the corresponding process parameters.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
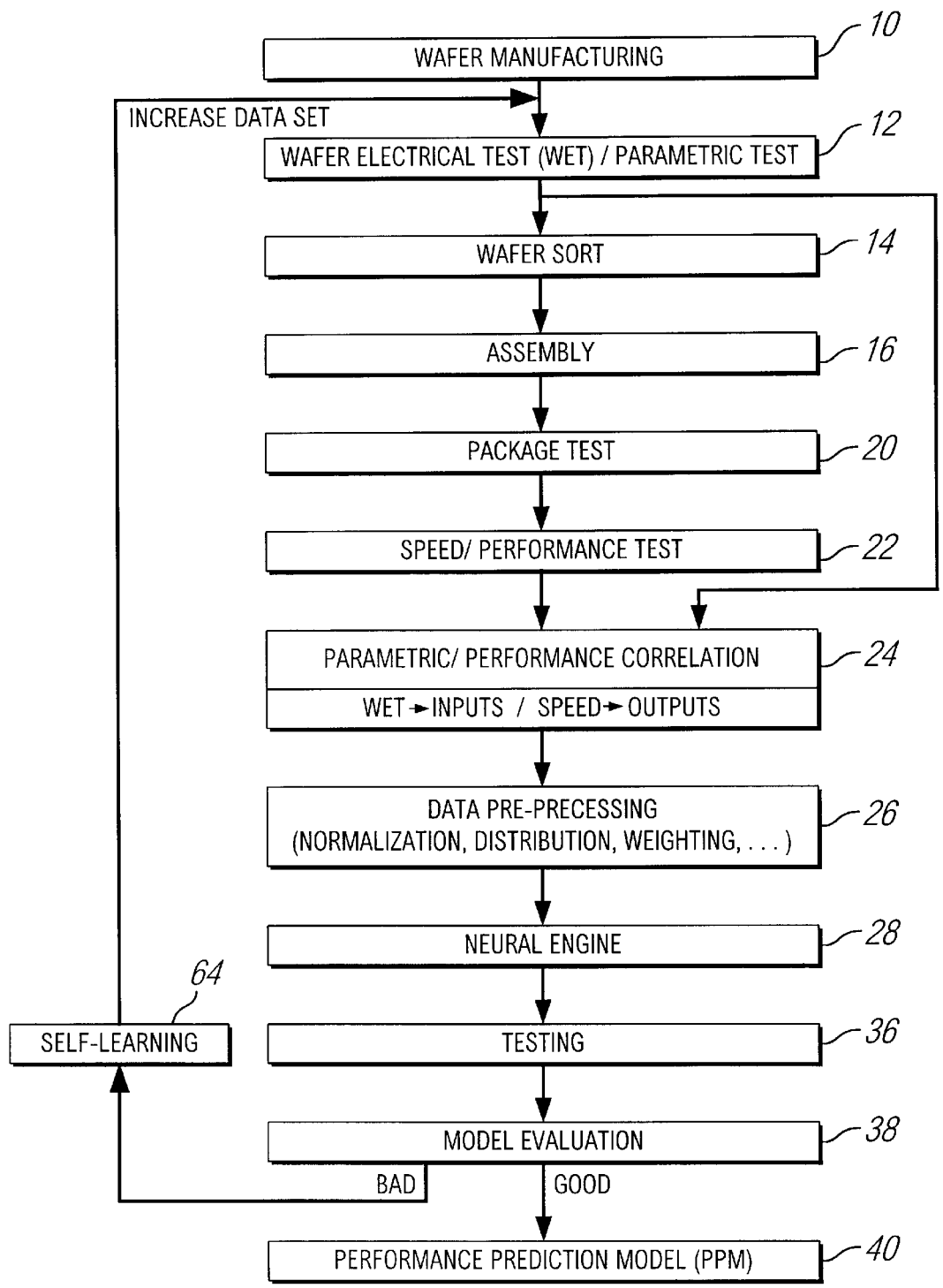
FIG. 1 is a flowchart illustrating a method for producing a performance prediction model for a microelectronic device in accordance with the present invention.

The present invention provides a computer implemented method for predicting the performance of a microelectronic device based on parametric test values obtained from electrical parameter testing at an early stage of fabrication. This method is illustrated in the flowchart of FIG. 1.

In the first step, which is designated by the reference numeral 10, a plurality, preferably a number of production lots of integrated circuit wafers are manufactured or fabricated. Each wafer has a plurality of microelectronic devices in the form of integrated circuit dies formed thereon. After fabrication, the devices or dies on the wafers are subjected to electrical parameter testing, known in the art as Wafer Electrical Testing (WET), to obtain parametric test values as indicated at 12. The WET testing can produce a large number, typically 150 to 300, of parametric values or parameters, including, for example, $V_{TN}$ (threshold voltage of NMOS field effect transistors), $I_{DN}$ (source/drain current of NMOS transistors in the linear and saturation regions), $V_{TP}$ (threshold voltage of PMOS transistors), $I_{DP}$ (source/drain current of PMOS transistors), metal 1/2/3 sheet rho (transconductance of 1st, 2nd and 3rd metal layers), etc.

Following WET testing, the wafers are subjected to wafer sorting at 14 to determine the functionality of each die, and grade the wafers according to the test results. Then, the individual passing dies are cut away from the wafers and assembled into individual packages which are provided with pins or other means for electrically interconnecting the microelectronic devices of the dies to external circuitry as indicated at 16. The assembled chips are then subjected to package testing at 20 to determine if the interconnections have been made properly.

Then, as indicated at 22, the finished integrated circuit chips are subject to functional and performance testing. The former tests including applying electrical test signals or test vector sets to inputs of the chips and reading data appearing at the outputs to detect any functional defects in the chips. The latter tests include testing the operating speed and other characteristics of the chips.

The results of the tests performed in step 22 include an operating speed for each device or die together with an indication of any defects in the device. There are many defect conditions which can occur, including functional failure of individual semiconductor circuitry elements, bad rows/columns/bits in cache and RAM memory, operating speed below a predetermined reject level, etc. The particular defect conditions which can occur are not the particular subject matter of the present invention. However, the invention can operate on a plurality of defect conditions as test outputs and categorize these conditions as will be described below.

After step 22 has been performed, the method will have obtained two sets of test data: parametric values resulting from the electrical parameter (WET) testing in step 12, and performance values resulting from the performance testing in step 22. The former values relate to the electrical characteristics of the microelectronic elements (field effect transistors, resistors, capacitors, metal lines, etc.) whereas the latter values relate to the functional performance of the overall devices as units.

A primary object of the invention as illustrated in FIG. 1 is to provide a function relating the parametric values to the performance values. Due to the large number of parametric values, the complex interaction therebetween and the non-linear nature of the interrelationships, it is beyond the scope of traditional computer implemented analysis to generate a conventional mathematical equation or set of equations that relates these inputs and outputs.

The present invention overcomes this problem by providing the required functional relationship in the form of an evolved computer model as will be described below. The computer model provides a performance prediction model which receives parametric values as inputs and generates predicted performance values as outputs, thereby implementing the required function.

Prior to actual derivation of the computer model, the parametric and performance values are correlated in a step 24. As described above, there will be a set of parametric values and performance values for certain locations on each wafer of each lot tested. These locations can typically correspond to the individual dies. Performance of step 24 results in a table including the values for each measured location of a wafer. Assuming that the parametric values or parameters are designated as P1, P2, P3 . . . Pn, a measured operating speed is designated as and various defect conditions are designated as D1, D2, D3 . . . Dm, the table will have a form which appears as follows for a single wafer, where 0 indicates no defect condition and 1 indicates a defect condition.

TABLE 1

| Location on Wafer | P1 | P2 | P3 | . . . Pn | S | D1 | D2 | D3 | . . . Dm |
|---|---|---|---|---|---|---|---|---|---|
| 0 | 0.2 | 20 | $1 \times 10^6$ | −2 | 82 | 0 | 1 | 0 | 0 |
| 1 | 0.35 | 30 | $2 \times 10^7$ | −3 | 78 | 1 | 0 | 0 | 0 |
| 2 | 0.4 | 25 | $5 \times 10^5$ | −5 | 104 | 0 | 0 | 0 | 0 |
| 3 | 0.1 | 24 | $3 \times 10^4$ | −4 | 98 | 0 | 0 | 1 | 1 |
| n | 0.5 | 22 | $4 \times 10^4$ | −3 | 91 | 0 | 0 | 0 | 0 |

It will be seen from TABLE 1 that there is a wide difference between the numerical data ranges of the parametric values, and that the defect values are in binary form. For this reason, a data preprocessing step 26 is performed which converts or normalizes the initial data into a form in which the values are comparable with each other.

Figure 2:
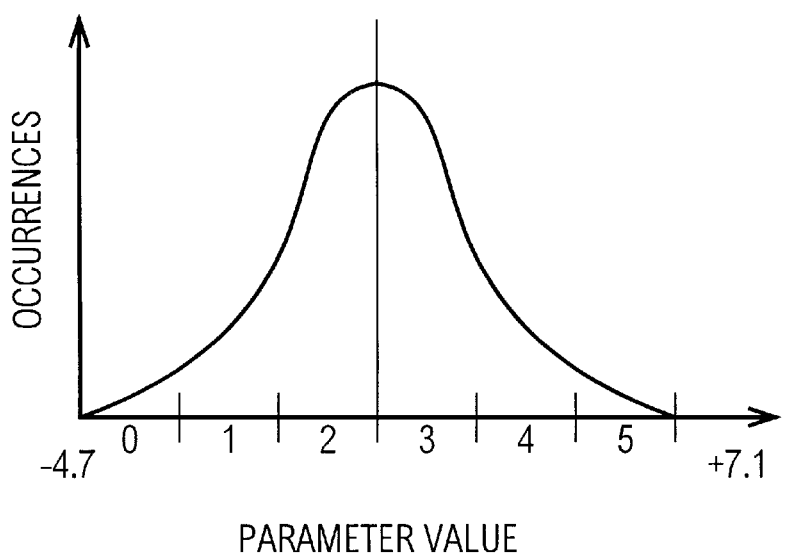
FIG. 2 is a graph illustrating a normalization step of the method.

As viewed in FIG. 2, all input data can be normalized into binary form and represented by a 0 or 1. FIG. 2 illustrates the exemplary distribution of one parametric value. The initial values of the parameter vary from 0 to 5. The maximum number of occurrences (devices or dies on a wafer having a given parametric value) is for the parametric value 2.5. Thus, binary normalization can be performed by normalizing an input value to 0 if the initial value is below 2.5, and 1 if the initial value is above 2.5.

Another binary normalization method which is applicable to the present invention is to calculate the average of the initial parametric values, and normalize a value to 0 if the initial value is below the average, and to 1 if the initial value is above the average value. For example, taking te parameter P1 in TABLE 1, the average value is 0.31. Normalization of the parameter P1 using the average value would produce the following binary normalized values.

TABLE 2

| Location on Wafer | P1 |
| --- | --- |
| 0 | 0 |
| 1 | 1 |
| 2 | 1 |
| 3 | 0 |
| n | 1 |

FIG. 2 further illustrates how input values can be linearly normalized into more than two values. It will be assumed that the initial parametric values for a particular parameter ranged from −4.7 to +7.1. This range of 11.8 is linearly divided into six equal increments, with each increment having a range of 1.97. Thus, the parameter is linearly normalized to have a value of 0 to 5 depending on which increment the initial value corresponded. In this manner, all of the input parameters can be normalized to have a value of 0 to 5 regardless of the initial input range. It will be noted that in the first example the values 0 to 5 represent the actual initial values of parameter 1, whereas in the last example the values 0 to 5 represented normalized incremental values of the actual initial values −4.7 to +7.1.

It is also within the scope of the invention to provide different normalizations for different parametric values. For example, one parameter can be normalized to two values (binary), another can be normalized to four values, another parameter can be normalized to six values, etc.

Figure 3:
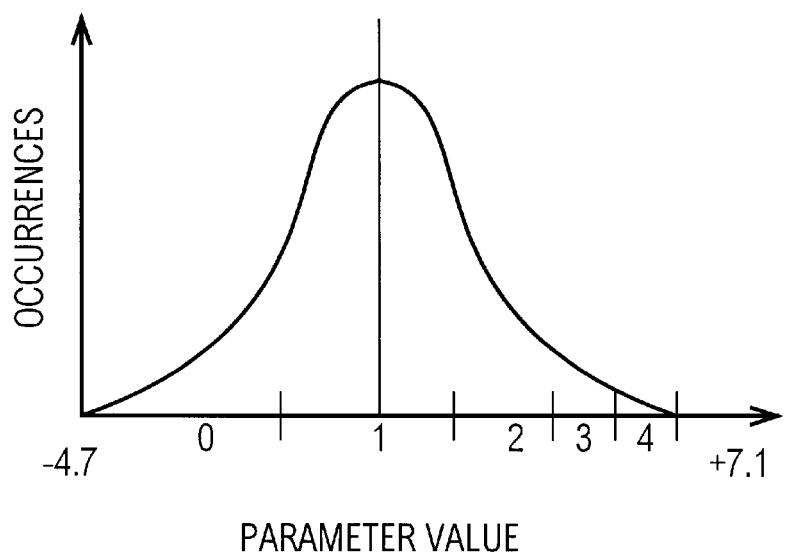
FIG. 3 is similar to FIG. 2, but illustrates an alternative normalization step.

FIG. 3 illustrates how non-linear normalization can be used in the present invention. The principle is similar to that described above with reference to FIG. 2, except that normalization is performed into five increments which are weighted using a sigma or other weighting criterion. In the illustrated example the increments become smaller from left to right as viewed in the drawing.

Figure 6:
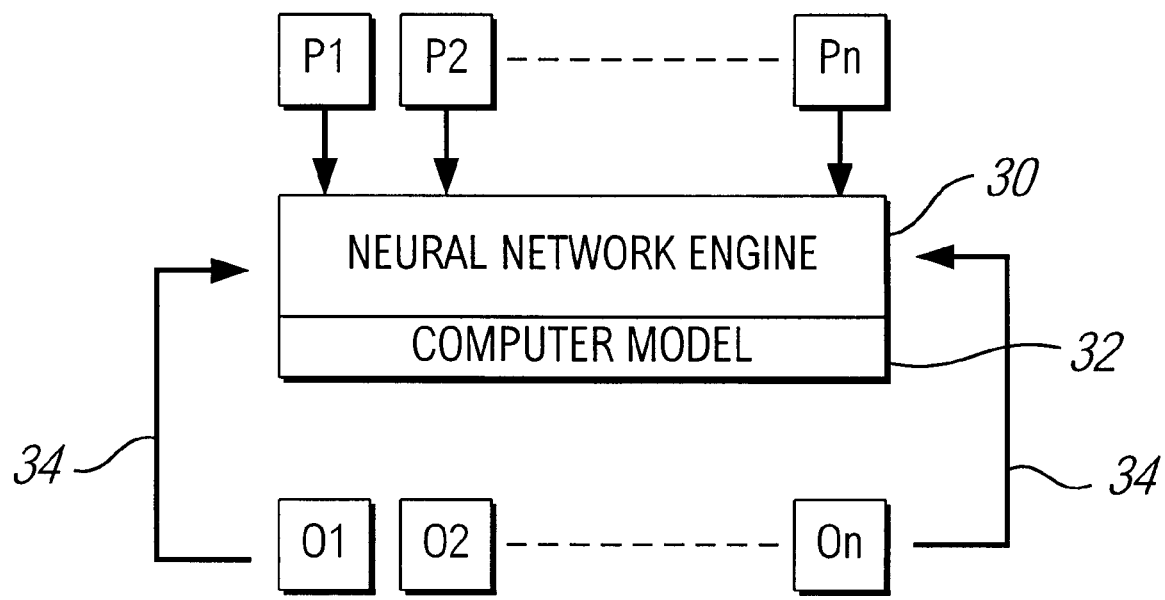
FIG. 6 is a diagram illustrating a neural network engine which can be used to practice the invention.

Returning to FIG. 1, a next step 28 of the present method is to provide a computer program which produces a computer model that implements a function relating outputs to inputs, and run the program on a digital computer with the parametric values as inputs and the performance values as outputs to produce a computer correlation model 32 as shown in FIG. 6. A preferred computer program for practicing the present invention is a back propagation neural network engine 30 such as illustrated in FIG. 6. Numerous neural network engines suitable for practicing the present invention are commercially available. Examples include Brainmaker by California Scientific Software of Nevada City, Calif. and SAS Neural Network Application by SAS Institute, Inc. of Cary, N.C.

A neural network engine includes a number of interconnected "layers" of elements or "neurons" which mimic the functionality of the human brain as understood to date. Input values propagate through layers from inputs to outputs. Each neuron consists of one or more weight values and mathematical operators which operate on the data propagating through the neuron. The operators can include multiplication, division, addition, subtraction, etc.

Parametric values P1 to Pn resulting from WET testing in step 12 are applied to the engine 30 as inputs, and the engine 30 produces performance values O1 to On as outputs. The performance values preferably include percentages of devices whose operating speeds or other performance parameters fall within predetermined respective ranges. For example, the output O1 can represent a speed range of less than 80 Mhz, the output O2 can represent a speed range of 80 to 90 Mhz, the output On can represent a speed range of more than 100 Mhz, etc. In this arrangement the outputs O1 to On can be thought of as "bins".

Where the outputs O1 to On are configured to represent percentages in this manner, the actual performance values obtained from the performance testing in step 22 are normalized to provide actual percentage values which the engine 30 will attempt to duplicate. When the inputs P1 to Pn are initially applied to the engine 30, the correlation model 32 represented by the operators and weights will be essentially random and the outputs O1 to On will not correspond well to the actual performance values.

The model 32 is continuously trained by back propagating the actual performance values to the input as indicated by feedback loops 34. The engine 30 executes a predetermined algorithm by which the outputs O1 to On are compared with the respective actual performance values and the weights are adjusted based on the differences therebetween. The engine 30 performs these operations on the data for all of the wafers once or a number of times. As the result of this operation, the correlation model 32 improves and progressively more closely implements a function which relates the inputs to the actual performance values. When the correlation model 32 has been fully evolved, it will produce outputs that closely approximate the actual performance values with the respective normalized parametric values applied as inputs.

It will be understood that although a neural network engine is a preferred means for practicing the invention, the scope of this disclosure is not so limited, and any other suitable computer implemented methodology which can produce a correlation model that implements a function relating inputs to outputs as described above can be used as an alternative to the neural network engine 30.

After the engine 30 has operated on a specified number of parametric and performance values and the correlation model 32 has evolved to some extent, it is tested in a step 36 to determine how well it predicts performance values in response to input parametric values. An evaluation is made in a step 38 to decide if the correlation model 32 is good enough for its intended use. If so, it is designated in a step 40 as a Performance Prediction Model (PPM) for use in predicting the performance of actual microelectronic devices. If not, the process is repeated for additional data values and self-learning in a step 64.

Although the parametric and performance values as described above represent individual microelectronic devices or dies on wafers, it is further within the scope of the invention to perform the method of FIG. 1 on average values representing more than one device. For example, averages of the parametric and performance values for all of the dies on a wafer can be calculated and applied to the engine 30 rather than the values for the individual dies. Extrapolating upwardly, it is further within the scope of the invention to take average values for all of the wafers of a particular lot and apply these values to the engine 30.

Figure 7:
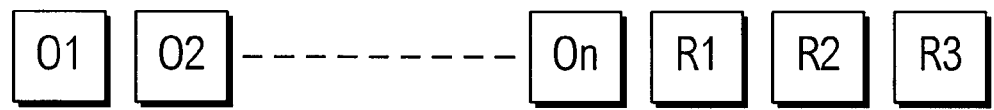
FIG. 7 is a diagram illustrating alternative outputs of the engine of FIG. 6.

FIG. 7 illustrates how the engine 30 can evolve the model 32 to produce various types of outputs. In this drawing, the engine 30 generates outputs O1 to On as described above which represent operating speed ranges. The engine 30 further generates output values R1 to R3 which represent percentages of devices (or wafers or lots) which have different types of defects. For example, the output R1 can represent failure of a certain functionality test of a microprocessor, the output R2 can represent bad rows/columns/bits in a cache memory of the processor, and the output R3 can represent faulty interconnections.

Figure 4:
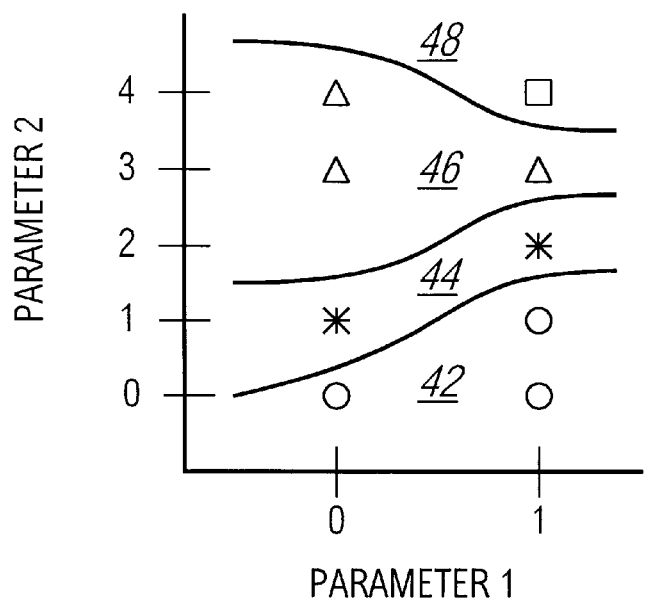
FIG. 4 is a graph illustrating a relationship between parametric values and performance values produced by the invention.
Figure 5:
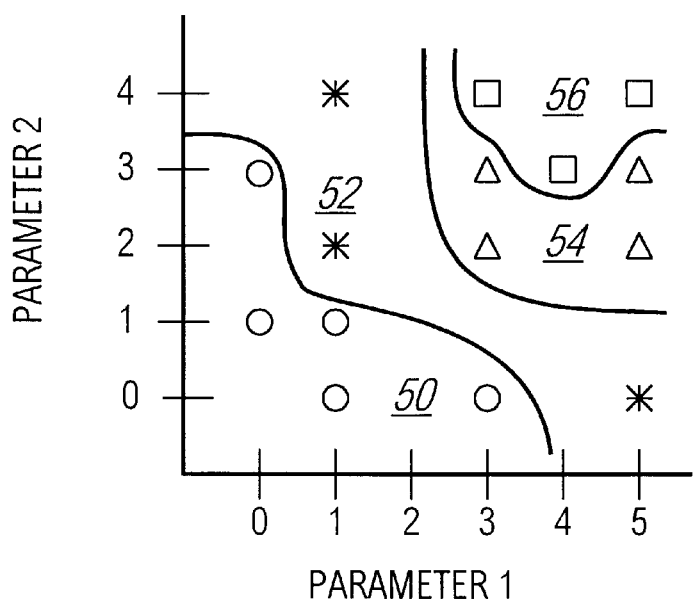
FIG. 5 is similar to FIG. 4 but illustrates an alternative relationship.

FIGS. 4 and 5 are simplified diagrams illustrating the relationships between parametric values and performance values. It will be assumed that the circle, asterisk, triangle and square symbols represent performance values in the form of microprocessor operating speed ranges of less than 80 Mhz, 80 to 90 Mhz, 90 to 100 Mhz and over 100 Mhz respectively. The axes of the graph represent normalized parametric values for two exemplary parameters. Parameter 1 has been binary normalized into two increments whereas parameter 2 has been linearly or non-linearly normalized into five increments.

The graph illustrates the relationship between the two parameters and one performance value in accordance with the correlation model 32. For example, when parameters 1 and 2 are both "1", the performance value is below 80 Mhz as represented by a circle symbol. When parameter 1 is "1" and parameter 2 is "3" the performance value is between 90 and 100 Mhz as represented by a triangle symbol. The graph illustrates how this relationship can be divided into regions of different performance values, e.g. regions 42, 44, 46 and 48 which include the different respective symbols.

In this manner, if the values of the parameters 1 and 2 were, for example, "0" and "1" respectively, the model 32 would predict that the operating speed would be between 80 and 90 MHz as represented by the asterisk symbol. FIG. 5 illustrates another example in which parameter 1 has six incremental values and parameter 2 has five incremental values. Further illustrated in FIG. 5 are performance regions 50, 52, 54 and 56 which are essentially similar to those described above with reference to FIG. 4.

FIGS. 4 and 5 illustrate the relationship between only two parametric values and one performance value. In actual practice there will be typically 150 to 300 parametric values and therefore 150 to 300 dimensions which cannot be illustrated in graphical form. However, the correlation model 32 functions to define performance regions based on combinations of all input parametric values (in all 150 to 300 dimensions) in a manner similar to that illustrated in simplified form in FIGS. 4 and 5. For each combination of 150 to 300 input parametric values, the model 32 will produce output predicted performance values.

Figure 8:
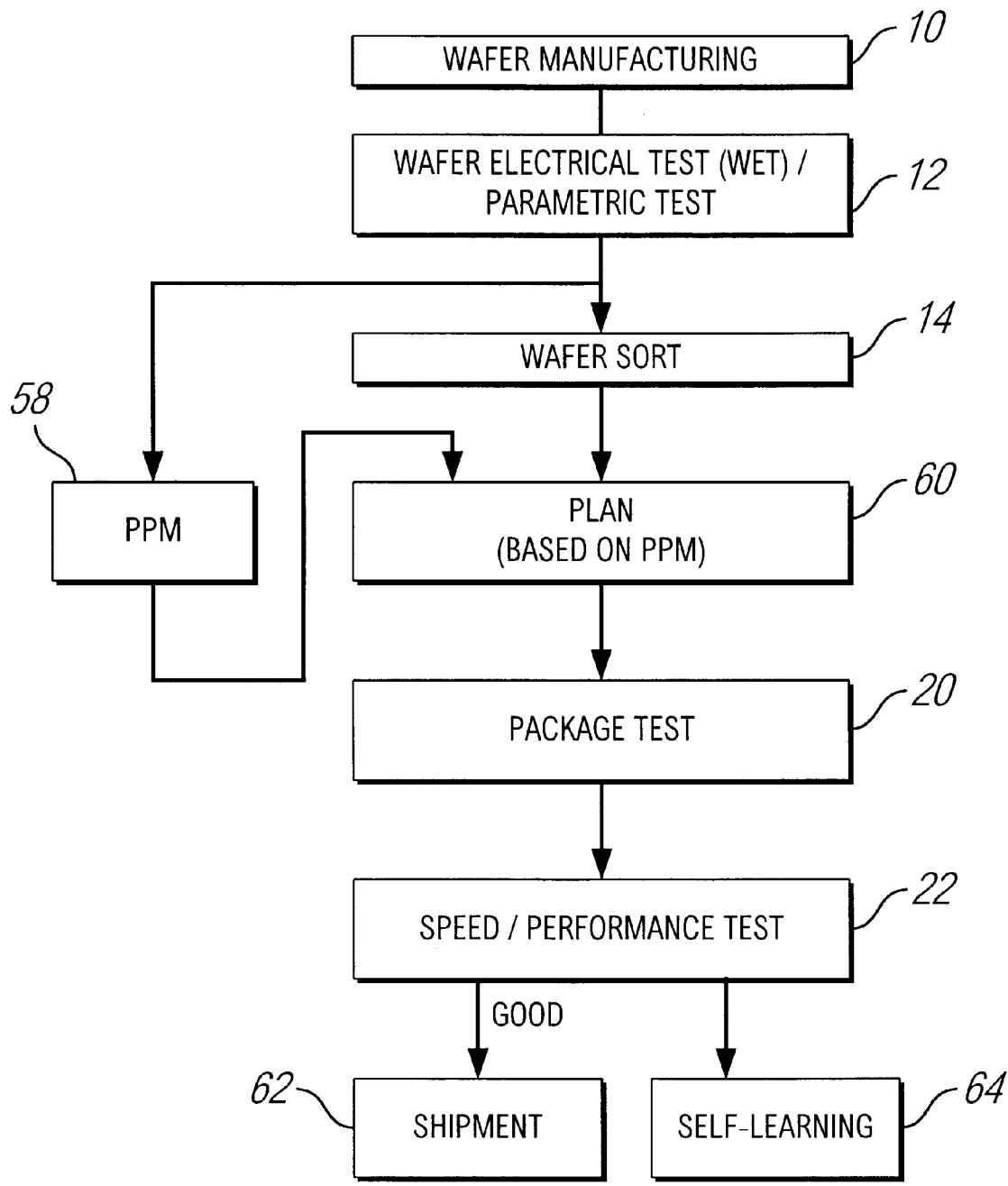
FIG. 8 is a flowchart illustrating how the present invention is used for predicting performance of a microelectronic device.

FIG. 8 illustrates how the correlation model 32 can be used to employ any measurement data to predict the performance of a production lot of integrated circuits, and provide production control planning data for management. Process steps which correspond to those in FIG. 1 are designated by the same reference numerals and will not be described repetitiously.

After the parametric values are obtained from the WET testing in step 12, these values are normalized and applied to the engine 30 which generates the correlation model 32. The model has to be proven to correlate to the output. The model 32 may require fine tuning until satisfactory results are achieved. In this case, the model 32 is ready to exercise performance prediction. The engine 30 produces predicted performance values in response to the input parametric values in a step 58.

The predicted performance values are utilized in combination with the results of the wafer sort step 14 in a planning step 60 to predict the percentages of chips which will be free of defects and will have speed values within predetermined ranges or bins. This data is valuable for managing sales as well as production since it provides estimates of the numbers of chips that will be available for sale as well as their quality as represented by the percentages of chips having operating speeds in the different ranges.

After performing the performance testing in step 22, the chips which passed the tests are shipped to customers, whereas the bad chips are rejected and discarded in a step 62. The performance values, which were obtained in the step 22, can now be used to further train the correlation model 32 in a step 64 as will be described below, and also to provide feedback to the production facility regarding the characteristics of unsatisfactory chips.

Figure 9:
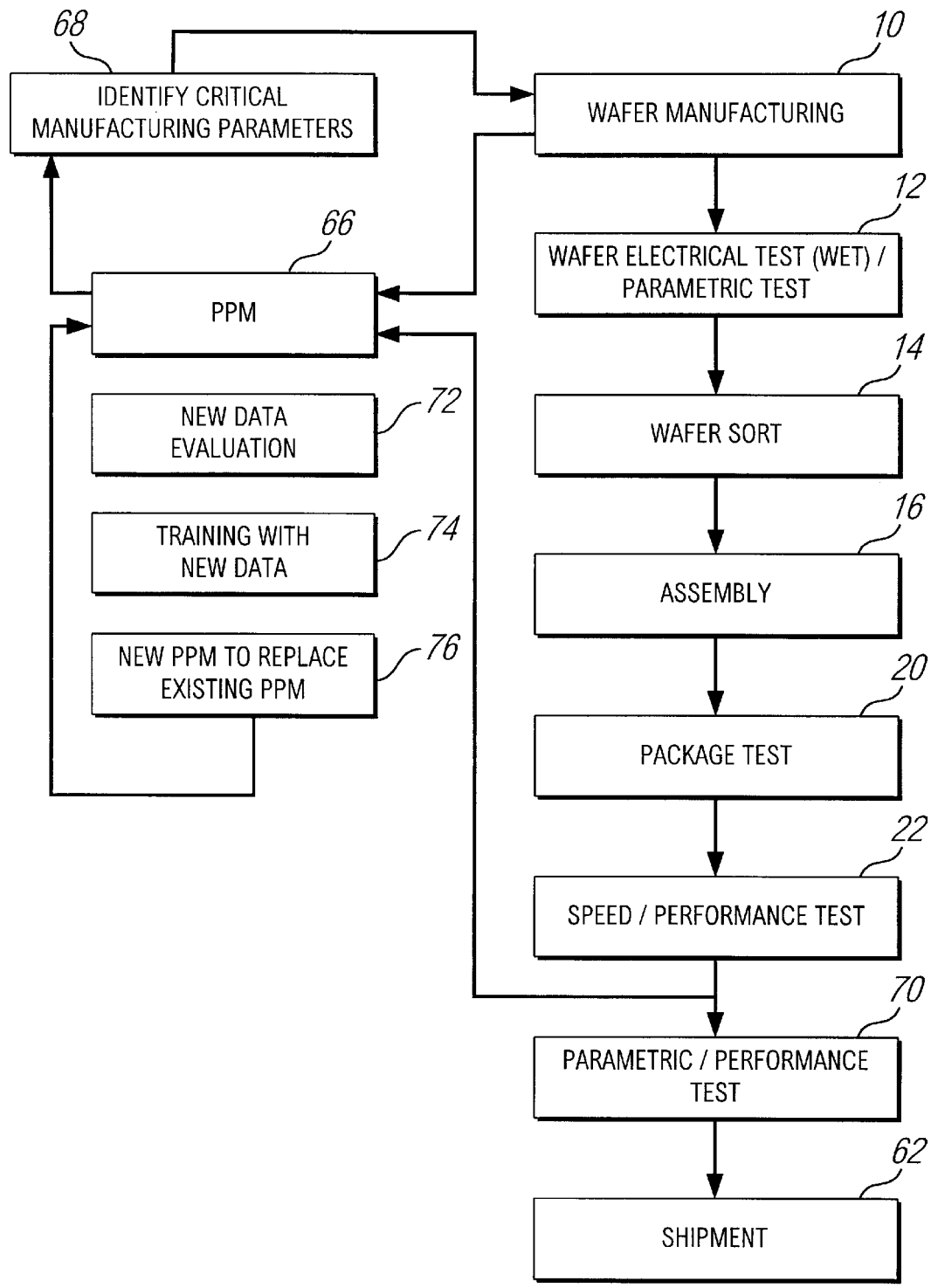
FIG. 9 is a flowchart illustrating how the present invention improves the performance prediction model, identifies parameters which result in low performance and improves devices being fabricated by adjusting the corresponding process parameters.

As illustrated in FIG. 9, the computer can be programmed to isolate parametric values which, if different, would produce higher predicted performance values. This analysis enables corresponding process parameters in the manufacturing facility to be adjusted to produce future chips with acceptable performance values and/or improve the performance of acceptable chips.

To isolate parametric values which result in poor performance values, the engine 30 and correlation model 32 are used to produce predicted performance values in a step 66. The parametric values for an unacceptable or poor performing die, wafer or lot are compared with those of an acceptable or high performing die, wafer or lot on a parameter by parameter basis in a step 68. Many or most parametric values will be similar for the two sets. However, there will be one or more parametric values that differ substantially, and indicate a reason for the poor performance values.

Assuming that a certain parametric value, for example $V_{TP}$ (threshold voltage of PMOS transistors), was significantly different between the two data sets. There are numerous process factors that determine threshold voltage, such as channel doping, gate oxide thickness, etc. Once the personnel in the manufacturing facility realize that the anomalous value of $V_{TP}$ is responsible for poor performance, they are able to adjust the channel doping, etc. to bring the value of $V_{TP}$ back into the normal range and thereby improve the performance of future fabricated chips.

FIG. 9 also illustrates how the correlation model 32 can be further trained by self-learning to improve its ability to accurately predict performance values. The performance of the model 32 is evaluated in a step 70. After the performance of the lot is predicted, data from a new lot will be used as additional data for model improvement. The new data (parametric and corresponding performance values) are correlated and normalized in a step 72 and used to train the model 32 in a step 74 a manner similar to that described above with reference to FIG. 1. After the model 32 has been trained on the new data set, the old model is replaced by an improved model in a step 76.

In summary, the present invention provides an automated and objective method for predicting the performance of integrated circuit chips based on electrical test parameters obtained at an early stage of fabrication. The present invention further provides a method for isolating electrical parametric values which, if different, would produce higher predicted performance, and feeding this information back to a production facility such that the fabrication process can be advantageously adjusted.

Various modifications will become possible for those skilled in the art after receiving the teachings of the present disclosure without departing from the scope thereof.

We claim:

1. A computer implemented method for producing a performance prediction model for a microelectronic device, comprising the steps of:
   (a) performing electrical parameter testing of a plurality of devices to obtain parametric values;
   (b) performing performance testing of said plurality of devices to obtain performance values;
   (c) providing a computer program which produces a computer model that implements a function relating outputs to inputs; and
   (d) running the program on a computer with the parametric values as inputs and the performance values as outputs to produce a computer model which constitutes the performance prediction model;
   in which step (c) comprises providing the program as a neural network engine.

2. A method as in claim 1, in which step (c) comprises providing the program as a back propagation neural network engine.

3. A method as in claim 1, further comprising the step, performed before step (d), of:
   (e) normalizing the parametric values.

4. A method as in claim 1, in which step (b) comprises performing speed testing of devices to obtain the performance values as including speed values.

5. A method as in claim 4, in which step (d) comprises configuring the program to produce the performance prediction model such that the speed values are output in the form of a percentage of devices having a speed value in a predetermined range.

6. A computer implemented method for producing a performance prediction model for a microelectronic device, comprising the steps of:
   (a) performing electrical parameter testing of a plurality of devices to obtain parametric values;
   (b) performing performance testing of said plurality of devices to obtain performance values;
   (c) providing a computer program which produces a computer model that implements a function relating outputs to inputs; and
   (d) running the program on a computer with the parametric values as inputs and the performance values as outputs to produce a computer model which constitutes the performance prediction model, in which:
   step (b) comprises performing speed testing of devices to obtain the performance values as including speed values; and
   step (d) comprises configuring the program to produce the performance prediction model such that the speed values are output in the form of percentages of devices having speed values in predetermined respective ranges.

7. A method as in claim 1, in which step (b) comprises performing reject testing of devices to obtain the performance values as including a reject value in the form of a percentage of devices of a predetermined reject type.

8. A method as in claim 7, in which step (b) comprises performing speed testing of devices to obtain the performance values as including speed values.

9. A method as in claim 8, in which step (d) comprises configuring the program to produce the performance prediction model such that the speed values are output in the form of a percentage of devices having a speed value in a predetermined range.

10. A computer implemented method for producing a performance prediction model for a microelectronic device, comprising the steps of:
    (a) performing electrical parameter testing of a plurality of devices to obtain parametric values;
    (b) performing performance testing of said plurality of devices to obtain performance values;
    (c) providing a computer program which produces a computer model that implements a function relating outputs to inputs; and
    (d) running the program on a computer with the parametric values as inputs and the performance values as outputs to produce a computer model which constitutes the Performance Prediction model, in which:
    step (b) comprises performing reject testing of devices to obtain the performance values as including a plurality of reject values in the form of percentages of devices of predetermined respective reject types.

11. A computer implemented method for producing a performance prediction model for a microelectronic device, comprising the steps of:
    (a) performing electrical parameter testing of a plurality of devices to obtain parametric values;
    (b) performing performance testing of said plurality of devices to obtain performance values;
    (c) providing a computer program which produces a computer model that implements a function relating outputs to inputs;
    (d) running the program on a computer with the parametric values as inputs and the performance values as outputs to produce a computer model which constitutes the performance prediction model;
    (e) performing electrical parameter testing of an additional plurality of devices to obtain additional parametric values;
    (f) running the program on the computer using the performance prediction model with the additional parametric values as inputs to obtain predicted performance values as outputs which constitute a prediction of the performance of the additional devices; and
    (g) isolating parametric values which, if different, would produce higher predicted performance values.

12. A method as in claim 1, further comprising the steps of:
    (e) performing electrical parameter testing of an additional plurality of devices to obtain additional parametric values;
    (f) performing performance testing of the additional plurality of devices to obtain additional performance values; and (g) running the program on the computer with the additional parametric values as inputs and the additional performance values as outputs to improve the performance prediction model by self-learning.

13. A computer implemented method for producing a performance prediction model for a microelectronic device, comprising the steps of:

(a) obtaining parametric values resulting from electrical parameter testing of a plurality of devices;

(b) obtaining performance values resulting from performance testing of said plurality of devices;

(c) providing a computer program which produces a computer model that implements a function relating outputs to inputs; and (d) running the program on a computer with the parametric values as inputs and the performance values as outputs to produce a computer model which constitutes the performance prediction model, in which:

step (c) comprises providing the program as a neural network engine.

14. A method as in claim 13, in which step (c) comprises providing the program as a back propagation neural network engine.

15. A method as in claim 13, further comprising the step, performed before step (d), of:

(e) normalizing the parametric values.

16. A method as in claim 13, in which step (b) comprises performing speed testing of devices to obtain the performance values as including speed values.

17. A method as in claim 16, in which step (d) comprises configuring the program to produce the performance prediction model such that the speed values are output in the form of a percentage of devices having a speed value in a predetermined range.

18. A computer implemented method for producing a performance prediction model for a microelectronic device, comprising the steps of:

(a) obtaining parametric values resulting from electrical parameter testing of a plurality of devices;

(b) obtaining performance values resulting from performance testing of said plurality of devices;

(c) providing a computer program which produces a computer model that implements a function relating outputs to inputs; and (d) running the program on a computer with the parametric values as inputs and the performance values as outputs to produce a computer model which constitutes the performance Prediction model, in which:

step (b) comprises performing speed testing of devices to obtain the performance values as including speed values; and step (d) comprises configuring the program to produce the performance prediction model such that the speed values are output in the form of percentages of devices having speed values in predetermined respective ranges.

19. A method as in claim 13, in which step (b) comprises performing reject testing of devices to obtain the performance values as including a reject value in the form of a percentage of devices of a predetermined reject type.

20. A method as in claim 19, in which step (b) comprises performing speed testing of devices to obtain the performance values as including speed values.

21. A method as in claim 20, in which step (d) comprises configuring the program to produce the performance prediction model such that the speed values are output in the form of a percentage of devices having a speed value in a predetermined range.

22. A computer implemented method for producing a performance prediction model for a microelectronic device, comprising the steps of:

(a) obtaining parametric values resulting from electrical parameter testing of a plurality of devices;

(b) obtaining performance values resulting from performance testing of said plurality of devices;

(c) providing a computer program which produces a computer model that implements a function relating outputs to inputs; and (d) running the program on a computer with the parametric values as inputs and the performance values as outputs to produce a computer model which constitutes the Performance prediction model, in which:

step (b) comprises performing reject testing of devices to obtain the performance values as including a plurality of reject values in the form of percentages of devices of predetermined respective reject types.

23. A computer implemented method for producing a performance prediction model for a microelectronic device, comprising the steps of:

(a) obtaining Parametric values resulting from electrical parameter testing of a plurality of devices;

(b) obtaining Performance values resulting from performance testing of said plurality of devices;

(c) providing a computer program which produces a computer model that implements a function relating outputs to inputs;

(d) running the program on a computer with the Parametric values as inputs and the performance values as outputs to produce a computer model which constitutes the performance prediction model;

(e) performing electrical parameter testing of an additional plurality of devices to obtain additional parametric values;

(f) running the program on the computer using the performance prediction model with the additional parametric values as inputs to obtain predicted performance values as outputs which constitute a prediction of the performance of the additional devices; and (g) isolating parametric values which, if different, would produce higher predicted performance values.

24. A method as in claim 22, further comprising the steps of:

(e) performing electrical parameter testing of an additional plurality of devices to obtain additional parametric values;

(f) performing performance testing of the additional plurality of devices to obtain additional performance values; and (g) running the program on the computer with the additional parametric values as inputs and the additional performance values as outputs to improve the performance prediction model by self-learning.

* * * * *